US006400061B1

United States Patent
Inoue et al.

(10) Patent No.: US 6,400,061 B1
(45) Date of Patent: Jun. 4, 2002

(54) SURFACE ACOUSTIC WAVE DEVICE AND SUBSTRATE THEREOF

(75) Inventors: Kenji Inoue, Tokyo; Tsuguo Fukuda, Sendai; Katsuo Sato, Tokyo; Hiroki Morikoshi, Tokyo; Katsumi Kawasaki, Tokyo; Kiyoshi Uchida, Tokyo, all of (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/574,310

(22) Filed: May 19, 2000

(30) Foreign Application Priority Data

Jun. 7, 1999 (JP) .......................................... 11-159908

(51) Int. Cl.$^7$ .............................................. H01L 41/08
(52) U.S. Cl. ................................................. 310/313 A
(58) Field of Search .......................... 310/313 R, 313 A, 310/313 B, 313 D

(56) References Cited

U.S. PATENT DOCUMENTS 5,917,265 A  *  6/1999  Naumenko et al. ..... 310/313 A
6,054,794 A  *  4/2000  Naumenko et al. ..... 310/313 A
6,072,264 A  *  6/2000  Naumenko et al. ..... 310/313 A

OTHER PUBLICATIONS

Extended Abstracts (The 43$^{rd}$ Spring Meeting, 1996); The Japan Society of Applied Physics and Related Societies.
Crystal Growth and Structural Characterization of New Piezoelectric Material $La_3Ta_{0.5}Ga_{5.5}O_{14}$; Jpn., H. Takeda et al., Jpn. J. Appl. Phys. vol. 36 (1997) pp. L919–L921.
Czochralski growth of $Sr_3Ga_2Ge_4O_{14}$ single crystals for piezoelectric applications; V.V. Kochurikhin et al., Journal of Crystal Growth 181 (1997) 452–454.
Growth and Characterization of $Na_2CaGe_6O_{14}$ Single Crystals; H. Takeda et al., Cryst. Res. Technol. 32 (1997) 939–945.
Growth and characterization of $La_3Ta_{0.5}Ga_{5.5}O_{14}$; single crystals; H. Kawanaka et al.; Journal of Crystal Growth 183 (1998) 274–277.
Czochralski growth of $RE_3Ga_5SiO_{14}$(RE=La, Pr, Nd) single crystals for the analysis of the influence of rare earth substitution on piezoelectricity; J. Sato et al.; Journal of Crystal Growth 191 (1998) 746–753.
Effect of starting melt composition on crystal growth of $La_3Ga_{0.5}Ga_{5.5}SiO_{14}$; H. Takeda et al; Journal of Crystal Growth 197 (1999) 204–209.
Growth of New Langasite Single Crystals for Piezoelectric Applications; T. Fukuda et al.; Proceedings of the Eleventh IEEE Int'l. Symposium on Applications of Ferroelectrics, Montreux, Switzerland, Aug. 24–27, 1998, 315–319.

(List continued on next page.)

Primary Examiner—Mark O. Budd
(74) Attorney, Agent, or Firm—Frishauf, Holtz, Goodman, Langer & Chick, P.C.

(57) ABSTRACT

The present invention provides a piezoelectric substrate for a surface acoustic wave device which has high electromechanical coupling coefficient and low SAW velocity, and a surface acoustic wave device using the same. The present invention applies a single crystal comprising belonging to a point group 32 and having $Ca_3Ga_2Ge_4O_{14}$ type crystal structure. The basic component of the single crystal is comprised of La, Sr, Ta, Ga and O and is represented by the chemical formula: $La_{3-x}Sr_xTa_{0.5+0.5x}Ga_{5.5-0.5x}O_{14}$. The composition ratio of Sr is preferably in the range of 0 ˙x≦0.15, and more preferably in the range of 0.07 ˙x≦0.08. The present invention also provides a surface acoustic wave device using that in which an interdigital finger electrode is formed in one main surface of the aforementioned piezoelectric substrate. When a cut angle of the substrate cut out of the single crystal and a propagation direction of surface acoustic waves are represented in terms of Euler angles (φ, θ, ψ), adequate characteristics can be obtained by selecting these angles.

10 Claims, 8 Drawing Sheets

OTHER PUBLICATIONS

Effect of (Sr,Ba) substitution in $La_3Ga_5SiO_{14}$ and $La_3M_{0.5}Ga_{5.5}O_{14}$ ($M=Nb^{5+}$, $Ta^{5+}$) crystals on their synthesis, structure and piezoelectricity; H. Takeda et al.; Journal of Alloys and Compounds 290 (1999) 79–84.

Crystal growth and structure of $La_3M^{4+}Ga_5O_{14}$ (M=Ti, Zr, Hf); H. Takeda et al.; Journal of Alloys and Compounds 290 (1999) 244–249.

Synthesis and structure of $La_3(M_{1/3} Ga_{2/3})Ga_5O_{14}$ ($M=Mo^{6+}$ and $W^{6+}$) crystals; H. Takeda et al.; Material Letters 41 (1999) 104–111.

Crystal Growth and Characterization of New Langasite-–type Compounds for Piezoelectric Applications; K. Shimamura et al.;Institute for Materials Research, Tohoku University, 980–8577, Japan, pp. 111–114.

* cited by examiner

FIG. 1

| MARK | COMPOSITION | CUT ANGLE | PROPAGATION DIRECTION | SAW VELOCITY (m/s) | $k^2$ (%) |
|---|---|---|---|---|---|
| 128LN | LiNbO3 | 128 DEGREE ROTATED Y | X | 3992 | 5.5 |
| 64LN | LiNbO3 | 64 DEGREE ROTATED Y | X | 4742 | 11.3 |
| 36LT | LiTaO3 | 36 DEGREE ROTATED Y | X | 4212 | 4.7 |
| LT112 | LiTaO3 | X | 112 DEGREE ROTATED Y | 3288 | 0.64 |
| ST QUARTZ | QUARTZ | ST | X | 3158 | 0.14 |

FIG. 3

| $\phi$ (°) | $\theta$ (°) | $\psi$ (°) | SAW VELOCITY (m/s) | $k^2$ (%) |
|---|---|---|---|---|
| 0 | 60 | 0 | 2281 | 0.2 |
| 0 | 60 | 20 | 2403 | 0.3 |
| 0 | 60 | -20 | 2395 | 0.3 |
| 0 | 60 | 40 | 2350 | 0.27 |
| 0 | 60 | -40 | 2352 | 0.27 |
| 0 | 90 | 0 | 2290 | 0.35 |
| 0 | 90 | 20 | 2440 | 0.36 |
| 0 | 90 | -20 | 2445 | 0.37 |
| 0 | 90 | 40 | 2415 | 0.1 |
| 0 | 90 | -40 | 2409 | 0.1 |
| 0 | 120 | 0 | 2330 | 0.13 |
| 0 | 120 | 20 | 2545 | 0.32 |
| 0 | 120 | -20 | 2527 | 0.34 |
| 0 | 120 | 40 | 2631 | 0.08 |
| 0 | 120 | -40 | 2634 | 0.1 |
| 0 | 140 | 20 | 2674 | 0.42 |
| 0 | 140 | -20 | 2677 | 0.41 |
| 0 | 140 | 40 | 2638 | 0.22 |
| 0 | 140 | -40 | 2636 | 0.22 |
| 0 | 160 | 20 | 2613 | 0.11 |
| 0 | 160 | -20 | 2620 | 0.12 |
| 0 | 160 | 40 | 2535 | 0.22 |
| 0 | 160 | -40 | 2550 | 0.2 |

FIG. 4

| φ (°) | θ (°) | ψ (°) | SAW VELOCITY (m/s) | $k^2$ (%) |
|---|---|---|---|---|
| 5 | 60 | 0 | 2285 | 0.19 |
| 5 | 60 | 20 | 2410 | 0.35 |
| 5 | 60 | -20 | 2393 | 0.26 |
| 5 | 60 | 40 | 2329 | 0.2 |
| 5 | 60 | -40 | 2381 | 0.27 |
| 5 | 90 | 0 | 2325 | 0.35 |
| 5 | 90 | 20 | 2415 | 0.36 |
| 5 | 90 | -20 | 2467 | 0.35 |
| 5 | 90 | 40 | 2374 | 0.09 |
| 5 | 90 | -40 | 2467 | 0.11 |
| 5 | 120 | 0 | 2345 | 0.15 |
| 5 | 120 | 20 | 2495 | 0.31 |
| 5 | 120 | -20 | 2577 | 0.33 |
| 5 | 120 | 40 | 2379 | 0.11 |
| 5 | 120 | -40 | 2653 | 0.12 |
| 5 | 140 | 20 | 2615 | 0.25 |
| 5 | 140 | -20 | 2669 | 0.41 |
| 5 | 140 | 40 | 2698 | 0.29 |
| 5 | 140 | -40 | 2576 | 0.16 |
| 5 | 160 | 0 | 2355 | 0.02 |
| 5 | 160 | 20 | 2521 | 0.08 |
| 5 | 160 | -20 | 2695 | 0.06 |
| 5 | 160 | 40 | 2631 | 0.29 |
| 5 | 160 | -40 | 2477 | 0.15 |

FIG. 5

| φ (°) | θ (°) | ψ (°) | SAW VELOCITY (m/s) | k² (%) |
|---|---|---|---|---|
| 30 | 40 | 0 | 2505 | 0.33 |
| 30 | 40 | 10 | 2539 | 0.52 |
| 30 | 40 | -10 | 2426 | 0.21 |
| 30 | 40 | 20 | 2373 | 0.08 |
| 30 | 40 | -20 | 2377 | 0.11 |
| 30 | 50 | 0 | 2474 | 0.35 |
| 30 | 50 | 10 | 2493 | 0.51 |
| 30 | 50 | -10 | 2418 | 0.21 |
| 30 | 50 | 20 | 2413 | 0.29 |
| 30 | 50 | -20 | 2405 | 0.14 |
| 30 | 60 | 0 | 2445 | 0.35 |
| 30 | 60 | 10 | 2457 | 0.52 |
| 30 | 60 | -10 | 2421 | 0.24 |
| 30 | 60 | 20 | 2392 | 0.35 |
| 30 | 60 | -20 | 2439 | 0.18 |
| 30 | 90 | 0 | 2411 | 0.47 |
| 30 | 90 | 10 | 2383 | 0.51 |
| 30 | 90 | -10 | 2496 | 0.42 |
| 30 | 90 | 20 | 2351 | 0.35 |
| 30 | 90 | -20 | 2599 | 0.27 |
| 30 | 120 | 0 | 2445 | 0.35 |
| 30 | 120 | 10 | 2446 | 0.35 |
| 30 | 120 | -10 | 2421 | 0.24 |
| 30 | 120 | 20 | 2392 | 0.49 |
| 30 | 120 | -20 | 2439 | 0.18 |
| 30 | 130 | 0 | 2474 | 0.35 |
| 30 | 130 | 10 | 2495 | 0.55 |
| 30 | 130 | -10 | 2418 | 0.22 |
| 30 | 130 | 20 | 2413 | 0.27 |
| 30 | 130 | -20 | 2405 | 0.16 |
| 30 | 140 | 0 | 2505 | 0.31 |
| 30 | 140 | 10 | 2371 | 0.54 |
| 30 | 140 | -10 | 2426 | 0.24 |
| 30 | 140 | 20 | 2373 | 0.06 |
| 30 | 140 | -20 | 2377 | 0.13 |

SURFACE ACOUSTIC WAVE DEVICE AND SUBSTRATE THEREOF

BACKGROUND OF THE INVENTION

1. Field of the Invention

The present invention relates to a surface acoustic wave device in which interdigital finger electrodes are provided on a piezoelectric substrate, and a piezoelectric substrate for the surface acoustic device.

2. Prior Art

In these years, mobile communication terminal equipments inclusive of portable phones has been rapidly popularized. In view of portability, it is desirable for such terminal equipments particularly to be compact and lightweight.

To achieve size and weight reductions for the terminal equipments, it is also necessary for electronic elements applied thereto to be compact and lightweight. For this reason, a surface acoustic wave device, i.e. a surface acoustic wave filter, which is advantageous to size and weight reductions has often been applied as a filter in high and intermediate frequency elements of the terminal equipments.

The surface acoustic wave device is of a structure in which an interdigital finger electrode is formed on a main surface of a piezoelectric substrate for exciting, receiving, reflecting or propagating surface acoustic waves. Important characteristics as to the piezoelectric substrate applied to this surface acoustic wave device are the surface wave velocity of the surface acoustic wave (thereinafter, sometime referred to as SAW velocity), the temperature coefficient of frequency (TCF) pertain to a center frequency in the case of filters or a resonance frequency in the case of a resonators, and an electromechanical coupling coefficient ($K^2$).

FIG. 1 shows a table listed various compositions of piezoelectric substrates which have typically been applied to the surface acoustic wave device so far. The well-known piezoelectric substrates shown in FIG. 1 can be broadly classified into two groups. One group includes 128LN, 64LN and 36LT which have fast SAW velocity and large electromechanical coupling coefficient, and another group includes LT112 and ST quartz which have relatively slow SAW velocity and small electromechanical coupling coefficient. Among these substrates, 128LN, 64LN and 36LT which are piezoelectric substrates having high SAW velocity and large electromechanical coupling coefficient are applied to surface acoustic wave filters in high frequency elements of the terminal equipments, while LT112 and ST quartz which are piezoelectric substrates having low SAW velocity and small electromechanical coupling coefficient are applied to surface acoustic wave filters in intermediate frequency elements of the terminal equipments. Because, in the surface acoustic wave filter, its center frequency is approximately directly proportional to the SAW velocity of the applied piezoelectric substrate and is approximately inversely proportional to the electrode finger width of the interdigital finger electrode formed on the piezoelectric substrate.

Therefore, when such a filter is constructed to apply to a high frequency circuit element, the substrate having high SAW velocity would be desired. In addition, since the filter applied to the high frequency circuit element of the terminal equipments is required to be a wideband filter whose passbandwidth is 20 MHz or more, it is also necessary for its electromechanical coupling coefficient to be large.

On one hand, the frequency band ranging from 70 to 300 MHz is used as the intermediate frequency for the mobile terminal equipments. In case that a filter which has a center frequency within this frequency band is constructed by a surface acoustic wave device, if the piezoelectric substrate having high SAW velocity is applied, it needs to considerably increase the electrode finger width formed on the substrate in proportion to the decreased amount of the center frequency, in comparison with that of the filter applied to the high frequency circuit. This causes a problem that the size of a surface acoustic wave device itself becomes large. Thus, LT112 or ST quartz having slow SAW velocity is generally applied to surface acoustic wave filters for intermediate frequency circuit elements. In particular, ST quartz is a desirable piezoelectric substrate material due to zero of its first order temperature coefficient of frequency. ST quartz can be constructed only for filters having narrow passband due to small electromechanical coupling coefficient of ST quartz. In the past, such small electromechanical coupling coefficient did not very become an issue because the function of intermediate frequency filters was to make only one narrow channel signal pass through.

However, in recent years, for the reason of effective utilization of frequency resources and adaptability to digital data communications, a digital mobile communication system has been developed, made practicable and rapidly popularized. The passbandwidth of this digital mobile communication system becomes extremely wide band, such as several hundred KHz to several MHz. In case that the intermediate frequency filter having such wide band is constructed by a surface acoustic wave device, it is difficult to be implemented in ST quartz. Further, when promoting size reduction of the mobile terminal equipment to enhance its portability, the mounting area of the surface acoustic filter for intermediate frequency is required to be reduced in size. However, ST quartz and LT112 which were described as materials suited to the surface acoustic filter for intermediate frequency so far have some limitation on size reduction due to the fact that their SAW velocity is over 3000 m/sec.

SUMMARY OF THE INVENTION

It is the object of the present invention to provide a piezoelectric substrate for a surface acoustic wave device which has high electromechanical coupling coefficient effective to widen passband and low SAW velocity effective to reduce in size of the surface acoustic wave device, and a wide band, compact surface acoustic wave device using the same.

To solve the problem described above, the present invention puts forward to use a piezoelectric substrate characterized in that the piezoelectric substrate comprises a single crystal belonging to a point group 32 and having $Ca_3Ga_2Ge_4O_{14}$ type crystal structure, and its basic component is comprised of La, Sr, Ta, Ga and O and is represented by the chemical formula $La_{3-x}Sr_xTa_{0.5+0.5x}Ga_{0.5-0.5x}O_{14}$. In this case, the composition ratio of Sr is preferably in the range of $0<x\leq0.15$, and more preferably in the range of $0.07<x\leq0.08$. According to a basic concept of the present invention, a possibility can be developed which a piezoelectric substrate having high electromechanical coupling coefficient and low SAW velocity effective is obtained by using the single crystal having the aforementioned composition as a piezoelectric substrate for a substrate acoustic wave device.

The present invention also provides a surface acoustic wave device using that in which an interdigital finger electrode is formed in one main surface of the aforementioned piezoelectric substrate.

According to one preferable aspect of the present invention, when a cut angle of the substrate cut out of the single crystal and a propagation direction of surface acoustic waves are represented in terms of Euler angles ($\phi$, $\theta$, $\psi$), these angles lie within the area 1: $\phi=-2.5°$ to $2.5°$, $\phi=60°$ to $120°$, $\psi=-40°$ to $40°$.

According to another aspect of the present invention, these angles lie within the area 2: $\phi=-2.5°$ to $2.5°$, $\theta=120°$ to $160°$, $\psi=10°$ to $50°$. In still another aspect of the present invention, these angles lie within the area 3: $\phi=-2.5°$ to $2.5°$, $\theta=120°$ to $160°$, $\psi=-50°$ to $-10=20$, the area 4: $\phi=2.5°$ to $7.5°$, $\theta=60°$ to $120°$, $\psi=-30°$ to $30°$, the area 5: $\phi=2.5°$ to $7.5°$, $\theta=120°$ to $160°$, $\psi=0°$ to $50°$, the area 6: $\phi=2.5°$ to $7.5°$, $\theta=120°$ to $160°$, $\psi=-40°$ to $-10°$, or the area 7: $\phi=27.5°$ to $32.5°$, $\theta=10°$ to $160°$, $\psi=-400°$ to $30°$.

When the aforementioned angles lie within the area 1, the SAW velocity of the substrate becomes less than or equal to 3000 m/sec and is presented in a lower value compared with that of ST quartz. In addition, there exists a combination of ($\phi$, $\theta$, $\psi$) in which the electromechanical coupling coefficient of the substrate is presented in a sufficiently high value, i.e. more than or equal to 0.2%. In the area 1, it is preferable to arrange in the range of $\phi=-2.5°$ to $2.5°$, $\theta=80°$ to $115°$, $\psi=-20°$ to $20°$. Within this preferable area, it has been found that on top of which the SAW velocity of the substrate becomes less than or equal to 3000 m/sec, the electromechanical coupling coefficient of the substrate becomes a sufficiently high value, i.e. more than or equal to 0.3%.

When the angles lie within the area 2, the SAW velocity of the substrate is also represented in a lower value compared with that of ST quartz, i.e. less than or equal to 3000 m/sec, and the electromechanical coupling coefficient of the substrate is represented in a sufficiently high value, i.e. more than or equal to 0.2%. In the area 2, it is preferable to arrange in the range of $\phi=-2.5°$ to $2.5°$, $\theta=130°$ to $150°$, $\psi=15°$ to $30°$. Within this preferable area, on top of which the SAW velocity of the substrate becomes less than or equal to 3000 m/sec, the electromechanical coupling coefficient of the substrate becomes a sufficiently high value compared with that of ST quartz, i.e. more than or equal to 0.3%. A similar result can be obtained in the area 3. In the area 3, it is preferable to arrange in the range of $\phi=-2.5°$ to $2.5°$, $\theta=130°$ to $150°$, $\psi=-30°$ to $-15°$ because of the same reason as that of the area 2. In the area 4 through 7, similar effects as those of the areas described above can also be obtained. Besides, in the area 7, it is preferable to arrange in the range of $\phi=27.5°$ to $32.5°$, $\theta=120°$ to $140°$, $\psi=5°$ to $15°$, or $\phi=27.5°$ to $32.5°$, $\theta=40°$ to $60°$, $\psi=5°$ to $15°$. In these preferable areas, the electromechanical coupling coefficient is presented in a significantly high value, i.e. more than or equal to 0.5%. As described above, according to the present invention, the electromechanical coupling coefficient of the substrate can be made large to achieve a wide band surface acoustic wave device. The SAW velocity of the substrate can also be slowed to reduce in size the surface acoustic wave device.

Since the single crystal of the chemical formula $La_{3-x}Sr_xTa_{0.5+0.5x}Ga_{5.5-0.5x}O_{14}$ is a trigonal system, mutually equivalent combinations of Euler angles exist due to crystal symmetry. Thus, in the present invention, similar effects can be obtained not only from the angles shown in the following embodiments, but also from the angles which are crystallographically equivalent to these embodiments. As example of the equivalent combinations, for example, a combination of (0°, 90°, 20°) on angles ($\phi$, $\theta$, $\psi$) in the area 1 is equivalent to a combination of (0°, 90°, −20°), or a combination of (240°, 90°, ±20°) and a combination of (120°, 90°, ±20°). A combination of (0°, 90°, 20°) included in the area 1 is also equivalent to a combination of (240°, 90°, ±20°), and a combination of (360°, 90°, ±20°). Further a combination of (30°, 90°, 0°) included in the area 3 is equivalent to a combination of (90°, 90°, 0°). Therefore, it is to be understood that the present invention includes equivalent range based on such symmetric property of the crystal.

The single crystal of $La_{3-x}Sr_xTa_{0.5+0.5x}Ga_{5.5-0.5x}O_{14}$ may have oxygen defect, and may includes inevitable impurities, such as Al, Zr, Fe, Ce, Nd, La, Pt, Ca, and the like.

BRIEF DESCRIPTION OF THE DRAWINGS

FIG. 1 is a table showing conventional piezoelectric substrates used for surface acoustic wave devices, and their characteristics.

FIG. 3 is a table showing characteristics of piezoelectric substrates for a surface acoustic wave device according to an embodiment of the present invention.

FIG. 4 is a table showing characteristics of piezoelectric substrates for a surface acoustic wave device according to another embodiment of the present invention.

FIG. 5 is a table showing characteristics of piezoelectric substrates for a surface acoustic wave device according to still other embodiment of the present invention.

DESCRIPTION OF THE PREFERRED EMBODIMENT

Figure 2:
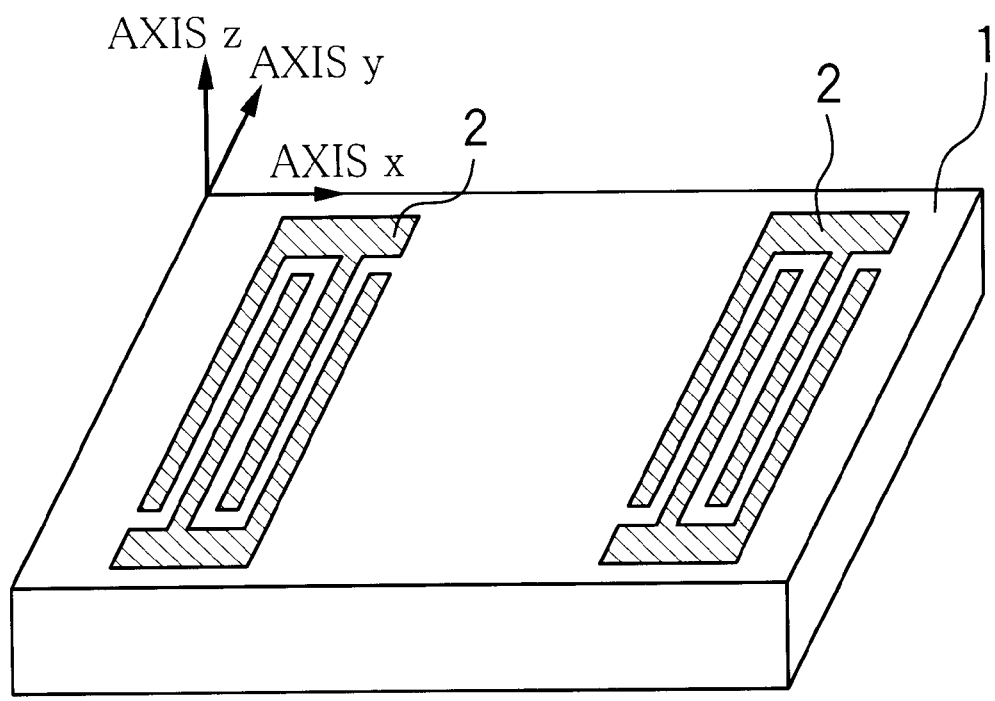
FIG. 2 is a perspective view showing one embodiment of a surface acoustic wave device implementing the present invention.

Hereinafter, one preferred embodiment of the present invention will be described with reference to the drawings. FIG. 2 shows one example of a surface acoustic wave device implementing the present invention. In this example, a pair of interdigital finger electrodes 2 is disposed on one main surface of a piezoelectric substrate 1. With respect to figuration, number and arrangement of the electrodes, any known configuration can be applied. The piezoelectric substrate 1 according to the present invention is comprised of a single crystal which is represented by the chemical formula: $La_{3-x}Sr_xTa_{0.5+0.5x}Ga_{5.5.-0.5x}O_{14}$ and belongs to a point group 32. This single crystal may have oxygen defect, and may includes inevitable impurities, such as Al, Zr, Fe, Ce, Nd, La, Pt, Ca, and the like. In FIG. 2, the axis x, the axis y and the axis z are orthogonal axes which meet at right angles respectively. The axis x and axis y are located within the substrate 1, and the axis x defines a propagation direction of surface acoustic waves. The axis z is perpendicular to the surface of the substrate 1 and defines a cut angle of the single crystal substrate, i.e. a cut face. The relationship between these axes x, y, z and the crystal axes X, Y, Z of the single crystal can be represented in terms of Euler angles($\phi$, $\theta$, $\psi$).

When the cut angle of the piezoelectric substitute 1 for the surface acoustic wave device according to the present invention is represented in terms of Euler angles, the angles ( , $\theta$, $\psi$) lie within either of the aforementioned areas 1, 2, 3, 4, 5, 6, 7 or the equivalent areas thereof.

Embodiment

A piezoelectric substrate 1 for a surface acoustic wave device is prepared from a single crystal which is represented by the chemical formula: $La_{3-x}Sr_xTa_{0.5+0.5x}Ga_{5.5-0.5x}O_{14}$ and belongs to a point group 32. The single crystal is grown by the CZ method using high frequency heating, i.e. the rotation pulling-up method. Various single crystal which include different composition ratio of Sr respectively can be pulled up by adequately selecting a compounding ratio of raw materials and its growth condition. The composition ratio of Sr was determined from the emission spectral analysis method by using the ICPC-8000 type of inductively coupled plasma emission spectrometry produced by Shimadzu Co. In the method in which Sr is substituted for La, when the composition ratio of Sr became larger than 0.15, adequate single crystal could not be obtained due to some kind of factor. When the composition ratio of Sr is larger than or equal to 0.05, the effect resulting from adding Sr is receded. Among single crystals which were relatively large and has adequate crystallinity, a substrate was cut out from a single crystal in which a composition ratio of Sr was 0.075, and the resulting substrate was used for the surface acoustic wave device.

Then, interdigital finger electrodes 2 for an input/output shown in FIG. 2 were formed on a surface of the piezoelectric substrate 1 which has been cut out from this single crystal, so that a experimental surface acoustic wave device was prepared. For forming the interdigital finger electrodes 2, an Al film was deposited on the substrate, and its figuration was then processed by the photo-etching method. The period of the electrode fingers corresponding to the wavelength $\lambda$ of surface acoustic waves was 60 $\mu$m, the number of the pairs was 20 pairs, the aperture width was 60$\lambda$ (3600 $\mu$m) and the film thickness was 0.3 $\mu$m. In FIG. 2, the axis x corresponds to a propagation direction of surface acoustic waves. The axis y corresponds to the direction orthogonal to a propagation direction of surface acoustic waves within the substrate surface. The axis z corresponds to a direction orthogonal to the substrate surface.

Figure 6:
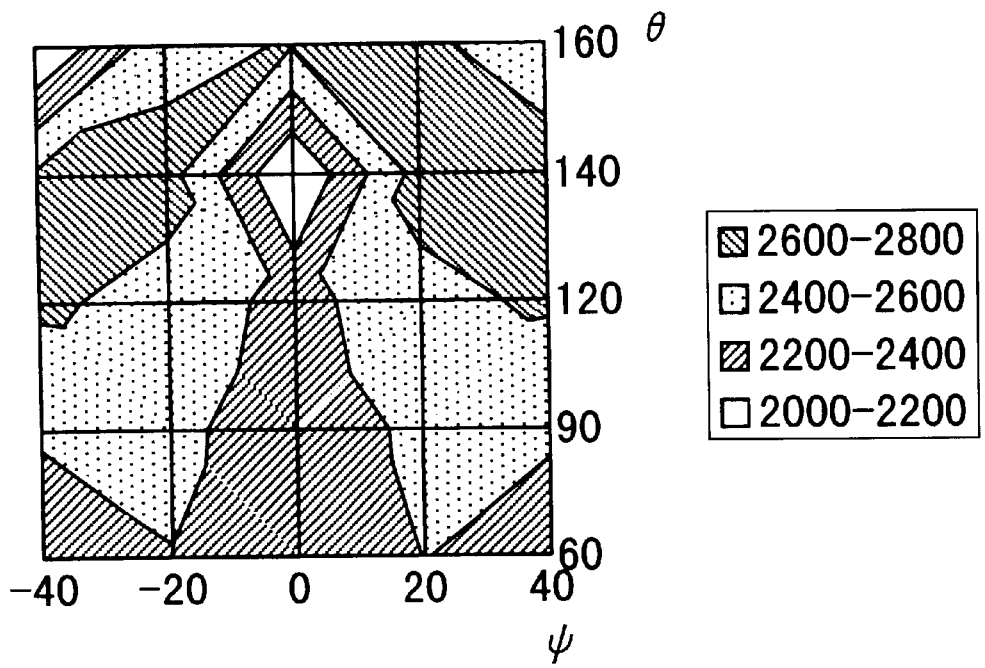
FIG. 6 is a diagram showing the SAW velocity in the piezoelectric substrate of the embodiment shown in FIG. 3 in relation to angle $\theta$ and angle $\psi$.
Figure 7:
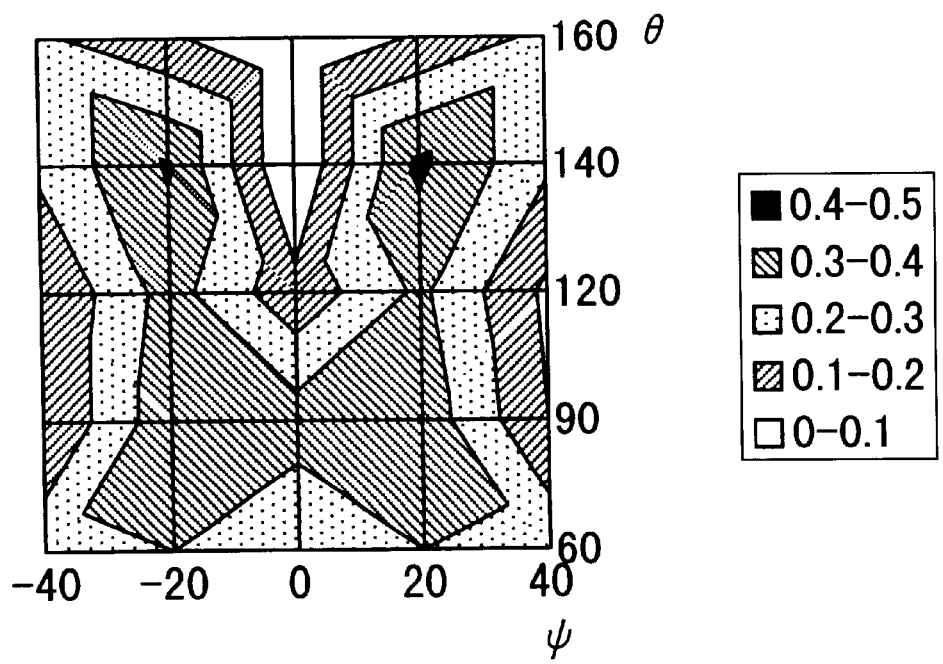
FIG. 7 is a diagram showing the electromechanical coupling coefficient in the piezoelectric substrate of the embodiment shown in FIG. 3 in relation to angle $\theta$ and angle $\psi$.
Figure 8:
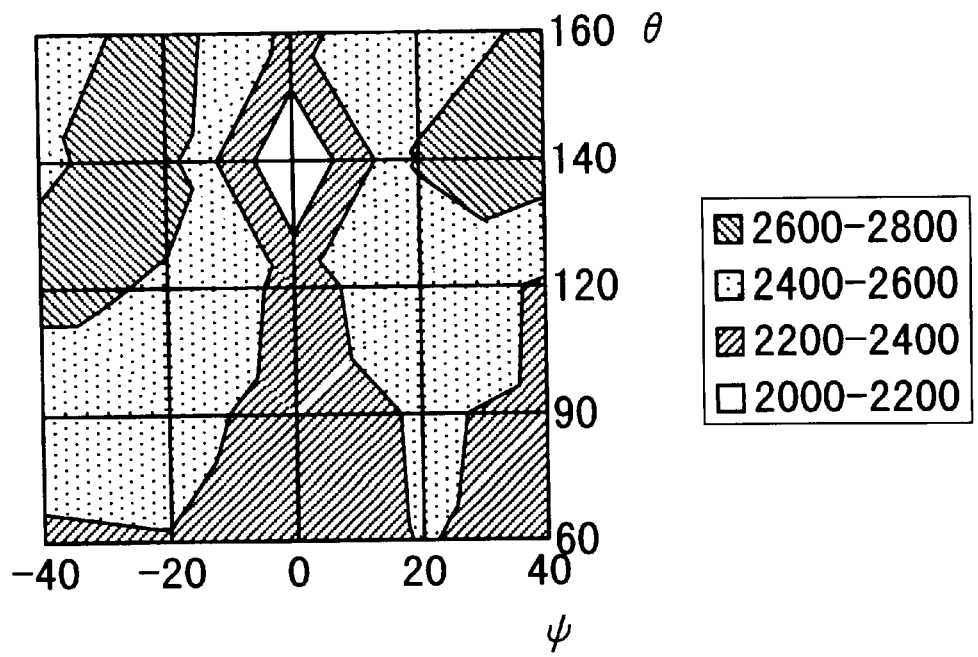
FIG. 8 is a diagram showing the SAW velocity in the piezoelectric substrate of the embodiment shown in FIG. 4 in relation to angle $\theta$ and angle $\psi$.
Figure 9:
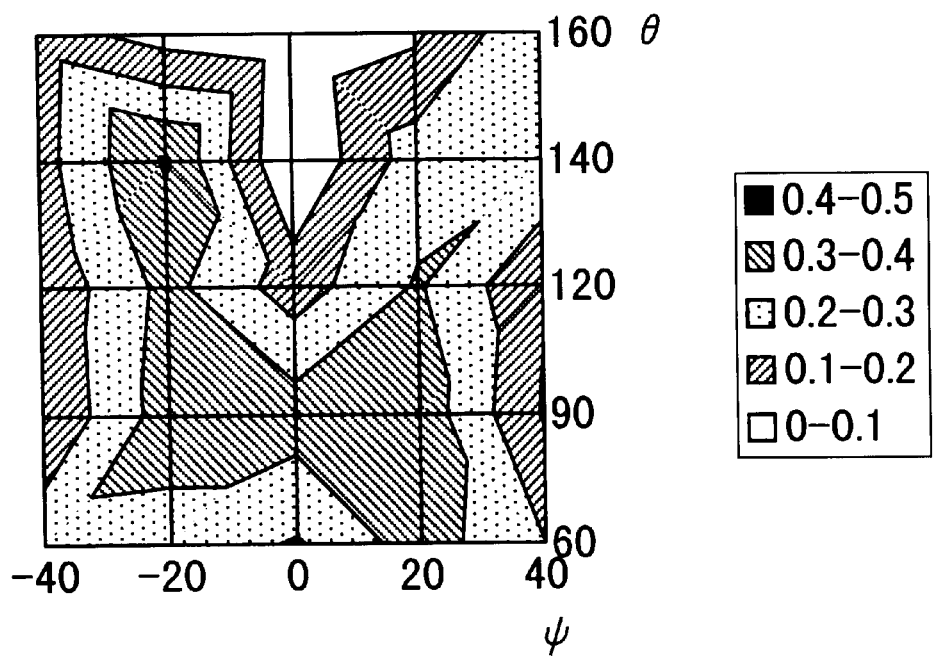
FIG. 9 is a diagram showing the electromechanical coupling coefficient in the piezoelectric substrate of the embodiment shown in FIG. 4 in relation to angle $\theta$ and angle $\psi$.
Figure 10:
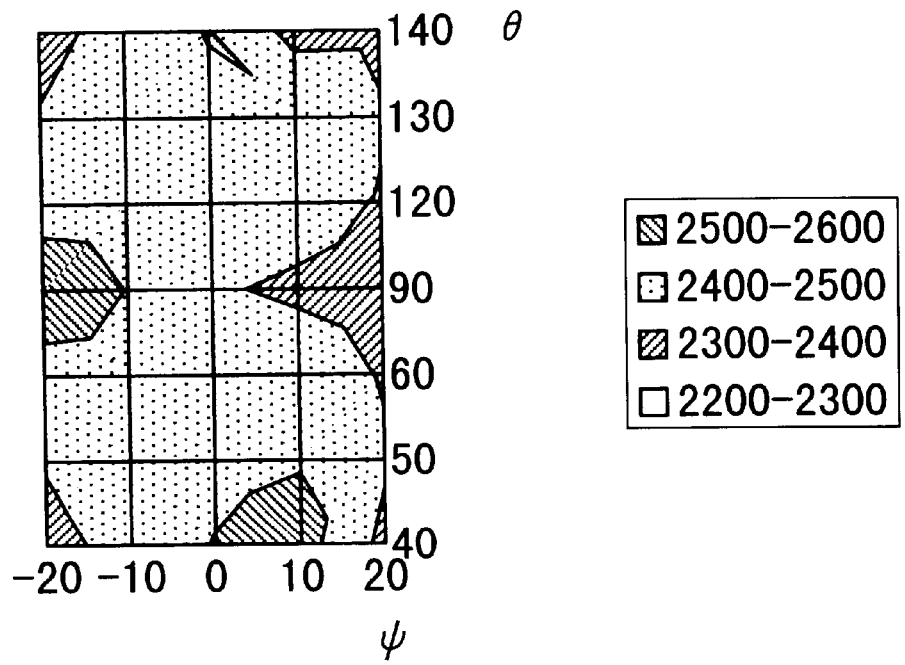
FIG. 10 is a diagram showing the SAW velocity in the piezoelectric substrate of the embodiment shown in FIG. 5 in relation to angle $\theta$ and angle $\psi$.
Figure 11:
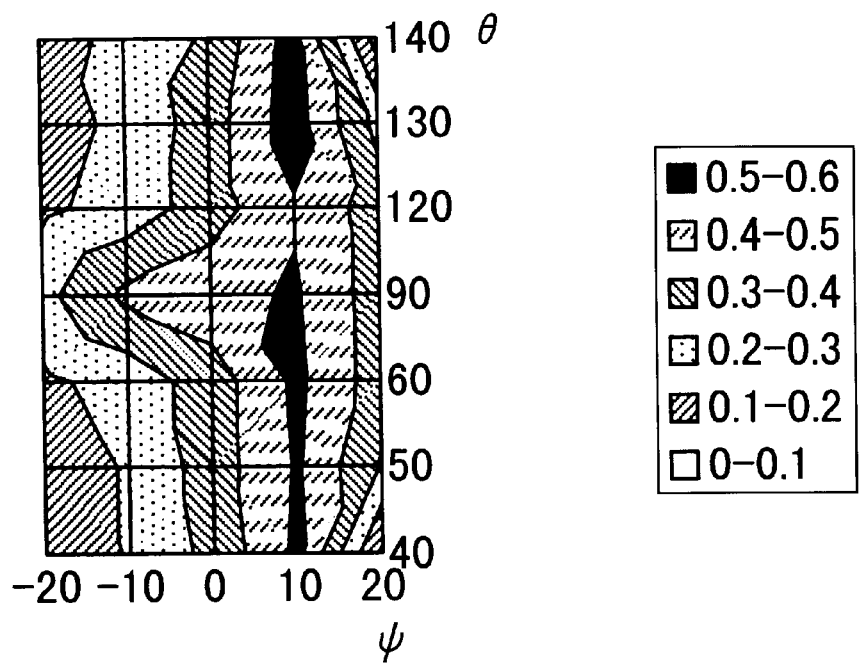
FIG. 11 is a diagram showing the electromechanical coupling coefficient in the piezoelectric substrate of the embodiment shown in FIG. 5 in relation to angle $\theta$ and angle $\psi$.

With varying the cut angle of the substrate and the propagation direction of surface acoustic waves, plural surface acoustic wave devices were prepared. The SAW velocity and the electromechanical coupling coefficient of each surface acoustic wave device are shown in FIG. 3, FIG. 4 and FIG. 5. A diagrams in which the SAW velocity and the electromechanical coupling coefficient are two dimensionally depicted based on the data of FIG. 3 is shown In FIG. 6 and FIG. 7. A diagrams in which the SAW velocity and the electromechanical coupling coefficient are two-dimensionally depicted based on the data of FIG. 4 is shown In FIG. 8 and FIG. 9. A diagrams in which the SAW velocity and the electromechanical coupling coefficient are two-dimensionally depicted based on the data of FIG. 5 is shown In FIG. 10 and FIG. 11. The SAW velocity was determined from multiplying a measured value of a center frequency among filter characteristics in the above mentioned interdigital finger electrode structure by the wavelength of surface acoustic waves. The electromechanical coupling coefficient was determined from the Smith equivalent circuit method by using a real part (conductance) and an imaginary part (suseptance) of an admittance which is measured between two terminals of one of the interdigital finger electrodes for the input and output, for example the input electrode. This method is described in detail in the publication entitled [Surface Wave Device and its applications] (editor: Electronic Materials Manufacturers Association of Japan. publisher: The Nikkan Kogyo Shimbun, Ltd. 1978), particularly in its Chapter 4.1.2 [The effective electromechanical coupling coefficient of surface waves] of 1. [Basic edition]. The above characteristics were measured with maintaining the ambient temperature of the device at 25° C.

As apparent from FIG. 3, FIG. 6 and FIG. 7, in case that angle $\phi$ is 0°, when angle $\theta$ is in the range of 60° to 120° and angle $\psi$ is in the range of −40°to 40°, the electromechanical coupling coefficient becomes more than or equal to 0.2% and the SAW velocity becomes less than or equal to 3000 m/sec. When angle $\theta$ is in the range of 80° to 115°, and angle $\psi$ is in the range of −20° to 20°, the electromechanical coupling coefficient becomes more than or equal to 0.3%. In case that angle $\phi$ is 0±2.5°, the same result can be obtained. In turn, in case that angle $\phi$ is 0°, when angle $\theta$ is in the range of 120° to 160° and angle $\psi$ is in the range of 10° to 50° or −50° to −10°, the electromechanical coupling coefficient becomes more than or equal to 0.2% and the SAW velocity becomes less than or equal to 3000 m/sec. When angle $\theta$ is in the range of 130° to 150°, and angle $\psi$ is in the range of 15° to 30°, the electromechanical coupling coefficient becomes more than or equal to 0.4%. In case that angle $\phi$ is 0±2.5°, the same result can be obtained.

As apparent from FIG. 4, FIG. 8 and FIG. 9, in case that angle $\phi$ is 5°, when angle $\theta$ is in the range of 60° to 120° and angle is in the range of −30° to 30°, the electromechanical coupling coefficient becomes more than or equal to 0.2% and the SAW velocity becomes less than or equal to 3000 m/sec. In case that angle $\phi$ is 5±2.50°, the same result can be obtained. In turn, in case that angle $\phi$ is 5°, when angle $\theta$ is in the range of 120° to 160° and angle $\psi$ is in the range of 0° to 50° or −40°to −10°, the electromechanical coupling coefficient becomes more than or in equal to 0.2% and the SAW velocity becomes less than or equal to 3000 m/sec. In case that angle $\phi$ is 5±2.5°, the same result can be obtained.

As apparent from FIG. 5, FIG. 10 and FIG. 11, in case that angle $\phi$ is 30° when angle $\theta$ is in the range of 10° to 160° and angle $\psi$ is in the range of −40° to 30°, the electromechanical coupling coefficient becomes more than or equal to 0.2% and the SAW velocity becomes less than or equal to 3000 m/sec. In case that angles is 30±2.5°, the same result can be obtained. When angle $\theta$ is in the range of 120° to 140° or 40° to 60° and angle $\psi$ is in the range of 5° to 15°, the electromechanical coupling coefficient can be more than or equal to 0.4%. In case that angle $\phi$ is 30±2.5° the same result can be obtained.

As apparent from the above, when the cut angle cut out from the single crystal and the propagation direction of surface acoustic waves are in the aforementioned range of the present invention, a surface acoustic device having sufficiently large the electromechanical coupling coefficient and slow SAW velocity can be obtain. Therefore, according to the present invention, it can be achieved to widen the band and reduce in size of the surface acoustic device.

What is claimed is:

1. A substrate for a surface acoustic wave device comprising a single crystal belonging to a point group 32 having $Ca_3Ga_2Ge_4O_{14}$ type crystal structure, wherein the basic component of said single crystal is represented by the chemical formula: $La_{3-x}Sr_xTa_{0.5+0.5x}Ga_{5.5-5x}O_{14}$, wherein x is in the range of $0 < x \leq 0.15$.

2. A substrate for a surface acoustic wave device in accordance with claim 1, wherein the composition ratio of Sr is in the range of $0.07 < x \leq 0.08$.

3. A surface acoustic wave device comprising a piezoelectric substrate, wherein said piezoelectric substrate is a substrate for a surface acoustic wave device in accordance with claim 1.

4. A surface acoustic wave device in accordance with claim 3, wherein: when a cut angle of said substrate cut out of the single crystal and a propagation direction of surface acoustic waves are represented in terms of Euler angles ($\phi, \theta, \psi$), these angles lie within the following area 1:

Area 1
$\phi = -2.5°$ to $2.5°$,
$\theta = 60°$ to $120°$,
$\psi = -40°$ to $40°$, or within the area crystallographically equivalent to said area 1.

5. A surface acoustic wave device in accordance with claim 3, wherein: when a cut angle of said substrate cut out of the single crystal and a propagation direction of surface acoustic waves are represented in terms of Euler angles ($\phi, \theta, \psi$), these angles lie within the following area 2:

Area 2
$\phi = -2.5°$ to $2.5°$,
$\theta = 120°$ to $160°$,
$\psi = 10°$ to $50°$, or within the area crystallographically equivalent to said area 2.

6. A surface acoustic wave device in accordance with claim 4, wherein: when a cut angle of said substrate cut out of the single crystal and a propagation direction of surface acoustic waves are represented in terms of Euler angles ($\phi, \theta, \psi$), these angles lie within the following area 3:

Area 3
$\phi = -2.5°$ to $2.5°$,
$\theta = 120°$ to $160°$,
$\psi = -50°$ to $-10°$, or within the area crystallographically equivalent to said area 3.

7. A surface acoustic wave device in accordance with claim 3, wherein: when a cut angle of said substrate cut out of the single crystal and a propagation direction of surface acoustic waves are represented in terms of Euler angles ($\phi, \theta, \psi$), these angles lie within the following area 4:

Area 4
$\phi = 2.5°$ to $7.5°$,
$\theta = 60°$ to $120°$,
$\psi = -30°$ to $30°$, or within the area crystallographically equivalent to said area 4.

8. A surface acoustic wave device in accordance with claim 3, wherein: when a cut angle of said substrate cut out of the single crystal and a propagation direction of surface acoustic waves are represented in terms of Euler angles ($\phi, \theta, \psi$), these angles lie within the following area 5:

Area 5
$\phi = 2.°$ to $7.5°$,
$\theta = 120°$ to $160°$,
$\psi = 0°$ to $50°$, or within the area crystallographicically equivalent to said area 5.

9. A surface acoustic wave device in accordance with claim 3, wherein: when a cut angle of said substrate cut out of the single crystal and a propagation direction of surface acoustic waves are represented in terms of Euler angles ($\phi, \theta, \psi$), these angles lie within the following area 6:

Area 6
$\phi = 2.5°$ to $7.5°$,
$\theta = 120°$ to $160°$,
$\psi = -40°$ to $-10°$, or within the area crystallographically equivalent to said area 6.

10. A surface acoustic wave device in accordance with claim 3, wherein: when a cut angle of said substrate cut out of the single crystal and a propagation direction surface acoustic waves are represented in terms of ($\phi, \theta, \psi$), these angles lie within the following area 7:

Area 7
$\phi = 27.5°$ to $32.5°$,
$\theta = 10°$ to $160°$,
$\psi = -40°$ to $30°$, or within the area crystallographically equivalent to said area 7

* * * * *